(12) United States Patent
Yamada et al.

(10) Patent No.: US 11,295,965 B2
(45) Date of Patent: Apr. 5, 2022

(54) CLEANING APPARATUS AND CLEANING METHOD OF SUBSTRATE PROCESSING APPARATUS

(71) Applicant: TOKYO ELECTRON LIMITED, Tokyo (JP)

(72) Inventors: Kohei Yamada, Kumamoto (JP); Hiroaki Inadomi, Kumamoto (JP); Satoshi Biwa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 85 days.

(21) Appl. No.: 16/188,671

(22) Filed: Nov. 13, 2018

(65) Prior Publication Data

US 2019/0148182 A1 May 16, 2019

(30) Foreign Application Priority Data

Nov. 14, 2017 (JP) .............................. JP2017-218700

(51) Int. Cl.
| | |
|---|---|
| *H01L 21/67* | (2006.01) |
| *H01L 21/02* | (2006.01) |
| *H01L 21/677* | (2006.01) |
| *B08B 9/093* | (2006.01) |
| *B08B 3/02* | (2006.01) |

(52) U.S. Cl.
CPC ........ *H01L 21/67051* (2013.01); *B08B 9/093* (2013.01); *H01L 21/02082* (2013.01); *H01L 21/67028* (2013.01); *H01L 21/67748* (2013.01); *B08B 3/024* (2013.01)

(58) Field of Classification Search
None
See application file for complete search history.

(56) References Cited

U.S. PATENT DOCUMENTS

| | | | | |
|---|---|---|---|---|
| 5,369,891 | A * | 12/1994 | Kamikawa | F26B 3/283 |
| | | | | 34/78 |
| 2002/0029791 | A1* | 3/2002 | Matsuoka | H01L 21/67253 |
| | | | | 134/18 |
| 2003/0009901 | A1* | 1/2003 | Kim | H01L 21/67034 |
| | | | | 34/73 |
| 2017/0117135 | A1* | 4/2017 | Yoshida | H01L 21/67051 |

FOREIGN PATENT DOCUMENTS

| | | |
|---|---|---|
| JP | 2012-503883 A | 2/2012 |
| JP | 2013-012538 A | 1/2013 |
| JP | 2013-055230 A | 3/2013 |

\* cited by examiner

*Primary Examiner* — Mikhail Kornakov
*Assistant Examiner* — Pradhuman Parihar
(74) *Attorney, Agent, or Firm* — Abelman, Frayne & Schwab

(57) ABSTRACT

A cleaning apparatus of a substrate processing apparatus according to an exemplary embodiment includes a nozzle and a scanner. The nozzle ejects a gas toward in an inner wall surface of a processing chamber in which a substrate is processed. The scanner causes the nozzle to scan along the inner wall surface of the processing chamber in the processing chamber.

8 Claims, 10 Drawing Sheets

CLEANING APPARATUS AND CLEANING METHOD OF SUBSTRATE PROCESSING APPARATUS

CROSS-REFERENCE TO RELATED APPLICATIONS

This application is based on and claims priority from Japanese Patent Application No. 2017-218700, filed on Nov. 14, 2017 with the Japan Patent Office, the disclosure of which is incorporated herein in its entirety by reference.

TECHNICAL FIELD

Exemplary embodiments described herein relate to a cleaning apparatus and a cleaning method of a substrate processing apparatus.

BACKGROUND

There has been known a substrate processing apparatus in the related art that forms a drying prevention liquid film on a front surface of a semiconductor wafer (hereinafter, referred to as a "wafer") serving as a substrate, and brings the wafer on which the liquid film is formed into contact with a high-pressure processing fluid of a supercritical state, thereby performing a drying processing. For example, Japanese Patent Laid-Open Publication No. 2013-012538 discloses a substrate processing apparatus capable of readily processing a substrate with a high-pressure processing fluid by forming the space of a processing chamber narrowly.

SUMMARY

A cleaning apparatus of a substrate processing apparatus according to an aspect of an exemplary embodiment includes a nozzle and a scanner. The nozzle ejects a gas toward an inner wall surface of a processing chamber in which a substrate is substrate. The scanner causes the nozzle to scan along the inner wall surface of the processing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
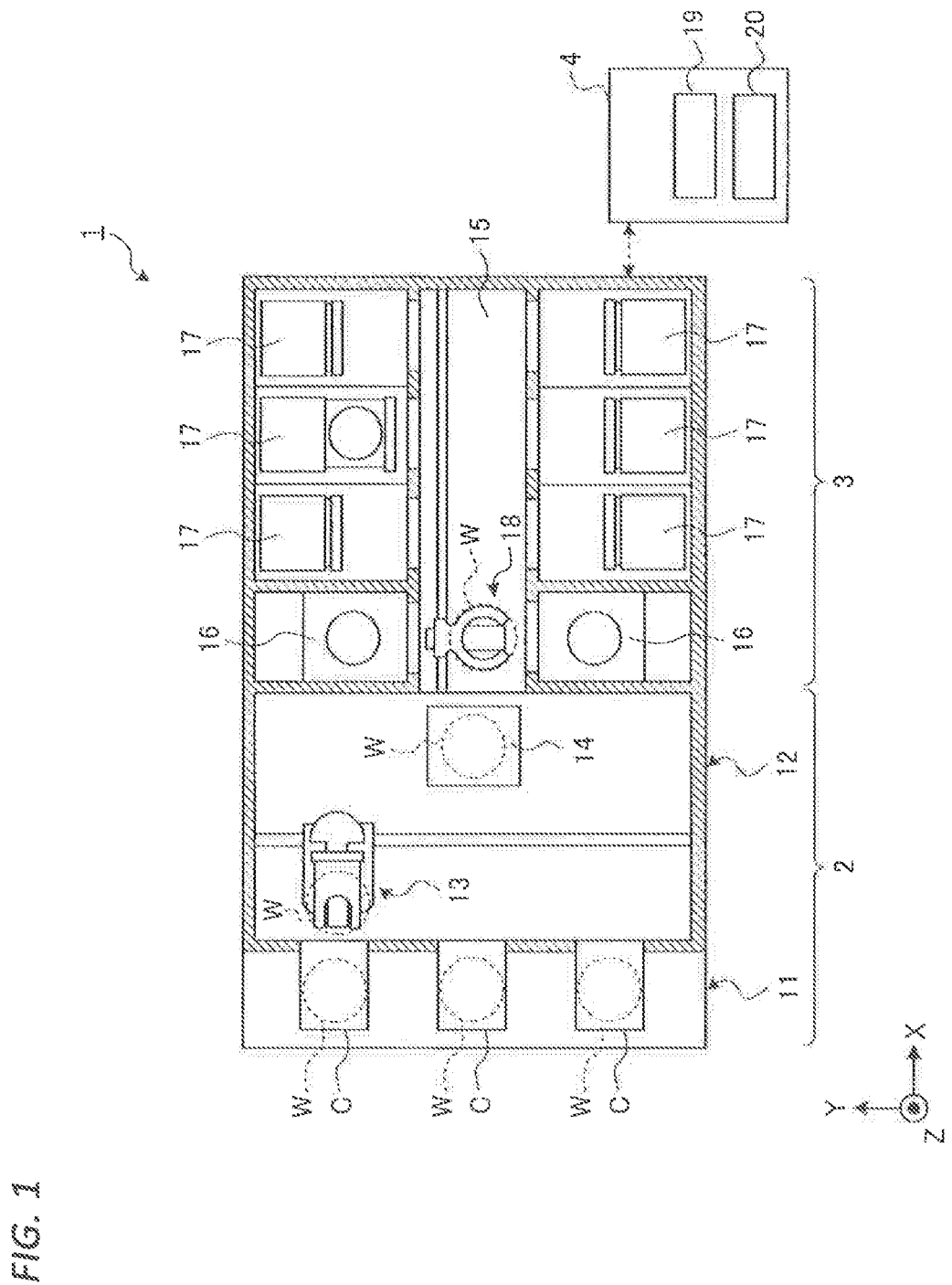
FIG. 1 is a schematic view illustrating a schematic configuration of a substrate processing system according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described substrate processing apparatus, since the space of the processing chamber is formed narrowly, it is difficult for an operator to perform manual cleaning.

An aspect of an embodiment has been made in consideration of the problems described above, and provides a cleaning apparatus and a cleaning method of a substrate processing apparatus that are capable of cleaning the inside of the narrow processing chamber cleanly.

A cleaning apparatus of a substrate processing apparatus according to an aspect of an exemplary embodiment includes a nozzle and a scanner. The nozzle ejects a gas toward an inner wall surface of a processing chamber in which a substrate is substrate. The scanner causes the nozzle to scan along the inner wall surface of the processing chamber.

The above-described cleaning apparatus further includes an exhaust path configured to exhaust the gas ejected from the nozzle onto the inner wall surface to an outside of the processing chamber.

In the above-described cleaning apparatus, the scanner is configured to cause the nozzle to scan toward the exhaust path.

In the above-described cleaning apparatus, the scanner is configured to cause the nozzle to scan in a direction in which the substrate is carried into the processing chamber from a carry-in port through which the substrate is carried into the processing chamber.

In the above-described cleaning apparatus, an ejection port of the gas formed in the nozzle is formed such that the gas is ejected in a direction toward the inner wall surface of the processing chamber and in a direction in which the nozzle is scanned.

In the above-described cleaning apparatus, the scanner is configured to cause the nozzle to scan along a main surface of the inner wall surface of the processing chamber.

A substrate processing apparatus according to an aspect of an exemplary embodiment includes: a processing chamber in which a substrate is processed; and a cleaning apparatus including: a nozzle configured to eject a gas toward an inner wall surface of the processing chamber, and a scanner configured to cause the nozzle to scan the inner wall surface of the processing chamber. In the processing chamber, a processing of bringing the substrate on which a liquid film is formed into contact with a processing fluid of a supercritical state so as to dry the substrate is performed.

A cleaning method of a substrate processing apparatus according to an aspect of an exemplary embodiment includes providing a nozzle configured to eject a gas toward an inner wall surface of a processing chamber in which a substrate is processed; and causing the nozzle to scan along the inner wall surface of the processing chamber.

According to one aspect of the embodiment, it is possible to clean the inside of a narrow processing chamber cleanly.

Hereinafter, embodiments of a cleaning apparatus and a cleaning method of a substrate processing apparatus disclosed herein will be described in detail with reference to the accompanying drawings. However, the present disclosure is not limited by the embodiments described below. It is required to note that the views are schematic and that the dimensional relationships and the proportions of respective elements may differ from those in the actual state. In addition, portions which differ from each other in dimensional relationships and proportions even between the views may be included in the drawings.

<Outline of Substrate Processing System>

First, a schematic configuration of a substrate processing system 1 according to an embodiment will be described with reference to FIG. 1. FIG. 1 is a view illustrating the schematic configuration of the substrate processing system 1 according to the embodiment. In the following description, in order to clarify a positional relationship, an X axis, a Y axis, and a Z axis orthogonal to each other are defined, and the Z-axis positive direction is defined as a vertically upward direction.

As illustrated in FIG. 1, the substrate processing system 1 includes a carry-in/out station 2, and a processing station 3. The carry-in/out station 2 and the processing station 3 are provided adjacent to each other.

The carry-in/out station 2 includes a carrier placing section 11 and a transport section 12. A plurality of carriers C each configured to accommodate a plurality of semiconductor wafers W (hereinafter, referred to as "wafers W") in a horizontal state are placed in the carrier placing section 11.

The transport section 12 is provided adjacent to the carrier placing section 11 and includes therein a substrate transport device 13 and a delivery unit 14. The substrate transport device 13 includes a wafer holding mechanism configured to hold a wafer W. Further, the substrate transport device 13 is capable of moving in the horizontal direction and the vertical direction and rotating about the vertical axis, and transports a wafer W between a carrier C and the delivery unit 14 using a wafer holding mechanism.

The processing station 3 is provided adjacent to the transport section 12. The processing station 3 includes a transport section 15, a plurality of cleaning processing units 16 and a plurality of drying processing units 17. The plurality of cleaning processing units 16 and the plurality of drying processing units 17 are arranged side by side on the opposite sides of the transport section 15. The arrangements and the numbers of the cleaning processing units 16 and the drying processing units 17 illustrated in FIG. 1 are merely an example, and are not limited thereto.

The transport section 15 includes the substrate transport device 13 therein. The substrate transport device 18 includes a wafer holding mechanism configured to hold a wafer W. Further, the substrate transport device 18 is capable of moving in the horizontal direction and the vertical direction and rotating about the vertical axis, and transports wafers W between a carrier C and the cleaning processing unit and the drying processing unit 17 using the wafer holding mechanism.

The cleaning processing unit 16 performs a predetermined cleaning processing on the wafers W transported by the substrate transport device 18. An exemplary configuration of the cleaning processing unit 16 will be described later.

The drying processing unit 17 performs a predetermined cleaning processing on the wafers W which have been subjected to the cleaning processing by the cleaning processing unit 16. The configuration of the drying processing unit 17 will be described later.

In addition, the substrate processing system 1 includes a control device 4. The control device 4 is, for example, a computer, and includes a controller 19 and a storage unit 20.

The controller 19 includes a microcomputer and various circuits including, for example, a central processing unit (CPU), a read only memory (ROM), a random-access memory (RAM), and an input/output port. The CPU of such the microcomputer reads and executes a program stored in the ROM so as to realize the control of the transport sections 12 and 15, the cleaning processing units 16, and the drying processing units 17.

In addition, the program may be recorded in a computer-readable storage medium and installed in the storage unit 20 of the control device 4 from the recording medium. The computer-readable storage medium includes, for example, a hard disk (HD), a flexible disk (FD), a compact disk (CD), a magneto optical disk (MO), and a memory card.

The storage unit 20 is realized by, for example, a semiconductor memory element such as a RAM or a flash memory, or a storage device such as a hard disk or an optical disk.

In the substrate processing system 1 configured as described above, first, the substrate transport device 13 of the carry-in/out station 2 takes out a wafer W from a carrier C placed on the carrier placing section 11 and places the taken-out wafer W on the delivery unit 14. The wafer W placed on the delivery unit 14 is taken out from the delivery unit 14 by the substrate transport device 18 in the processing station 3 and is carried into the cleaning processing unit 16.

The wafer W carried into the cleaning processing unit 16 is subjected to a cleaning processing by the cleaning processing unit 16 and is then carried out from the cleaning processing unit 16 by the substrate transport device 18. The wafer W carried out from the cleaning processing unit 16 is carried into the drying processing unit 17 by the substrate transport device 18, and is subjected to a drying processing by the drying processing unit 17.

The wafer W which has been subjected to the drying processing by the drying processing unit 17 is carried out from the drying processing unit 17 by the substrate transport device 18 and placed on the delivery unit 14. The completely processed wafer W placed on the deliver unit 14 is returned to the carrier C of the carrier placing section 11 by the substrate transport device 13.

<Outline of Cleaning Processing Unit>

Figure 2:
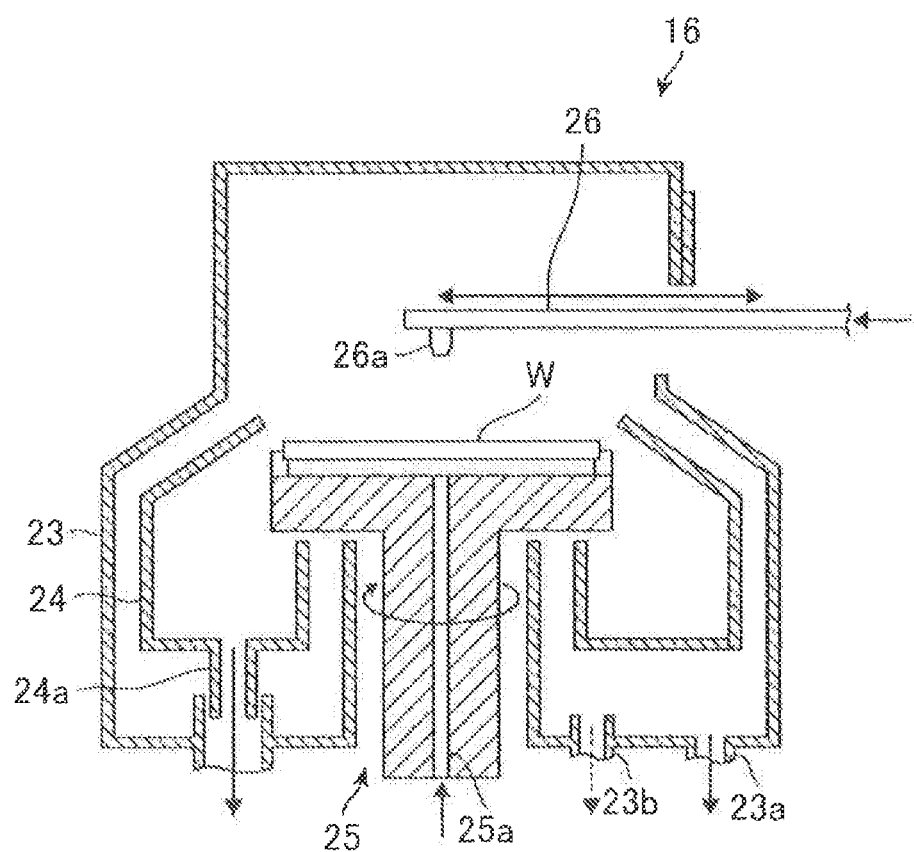
FIG. 2 is a cross-sectional view illustrating the configuration of a cleaning processing unit according to the embodiment.

Next, the schematic configuration of the cleaning processing unit 16 will be described with reference to FIG. 2. FIG. 2 is a cross-sectional view illustrating the configuration of the cleaning processing unit 16 according to the embodiment. The cleaning processing unit 16 is configured as, for example, a single wafer-type cleaning apparatus that cleans wafers W one by one by spin cleaning.

As illustrated in FIG. 2, the cleaning processing unit 16 holds the wafer W substantially horizontally using a wafer holding mechanism 25 disposed inside an outer chamber 23 forming a processing space, and rotates the wafer holding mechanism 25 around the vertical axis, thereby rotating the wafer W. In addition, the liquid processing unit 16 introduces a nozzle arm 26 above the rotating wafer W and supplies a chemical liquid and a rinse liquid from the chemical liquid nozzle 26a provided at the tip end of the nozzle arm 26 in a predetermined order, thereby performing a cleaning processing on the front surface of the wafer W.

In the liquid processing unit 16, a chemical liquid supply path 25a is also formed inside the wafer holding mechanism 25. Then, the rear surface of the wafer W is also cleaned by the chemical liquid and the rinse liquid supplied from the chemical liquid supply path 25a.

In the wafer W cleaning processing described above, for example, particles and organic pollutants are first removed by an SC1 liquid (a mixture liquid of ammonia and hydrogen peroxide) which is an alkaline chemical liquid, and then rinse cleaning is performed with deionized water (hereinafter, referred to as "DIW") which is a rinse liquid. Next, a natural oxide film is removed by a dilute hydrofluoric acid (hereinafter, referred to as "DHF"), which is an acidic chemical liquid, and then rinse cleaning with DIW is performed.

The aforementioned various chemical liquids are received by the outer chamber 23 or an inner cup 24 disposed inside the outer chamber 23 and are discharged from a liquid discharge port 23a provided in the bottom of the outer chamber 23 or a liquid discharge port 24a provided in the bottom of the inner cup 24. Further, the atmosphere in the outer chamber 23 is exhausted from the exhaust port 23b provided in the bottom of the outer chamber 23.

After the rinse processing of the wafer W described above, an IPA in a liquid state (hereinafter, referred to as an "IPA liquid") is supplied to the front and rear surfaces of the wafer W while rotating the wafer holding mechanism 25, thereby replacing the DIW remaining on both sides of the wafer W with the IPA liquid. Then, the rotation of the wafer holding mechanism 25 is slowly stopped.

The wafer W, on which the cleaning processing has been completed in this way, is delivered to the substrate transport device 18 by a delivery mechanism (not illustrated) provided in the wafer holding mechanism 25 in a state where the IPA liquid is deposited on the front surface thereof (a state where a liquid film of the IPA liquid is formed on the front surface of the wafer W), and is carried out from the cleaning processing unit 16.

Here, the IPA liquid deposited on the front surface of the wafer W serves as a drying prevention liquid that prevents pattern collapse from being caused due to the evaporation (vaporization) of the liquid on the front surface of the wafer W while the wafer W is being transported from the cleaning processing unit 16 to the drying processing unit 17 or while the wafer W is being carried into the drying processing unit 17.

After the cleaning processing in the cleaning processing unit 16 is completed, the wafer W having the IPA liquid deposited on the front surface is transported to the drying processing unit 17. Then, a wafer W drying processing is performed by bringing $CO_2$ in a supercritical state (hereinafter, also referred to as "supercritical fluid") into contact with the IPA liquid on the front surface of the wafer W in the drying processing unit 17 such that the IPA liquid is dissolved and removed with the supercritical fluid.

<Outline of Drying Processing Unit>

Figure 3:
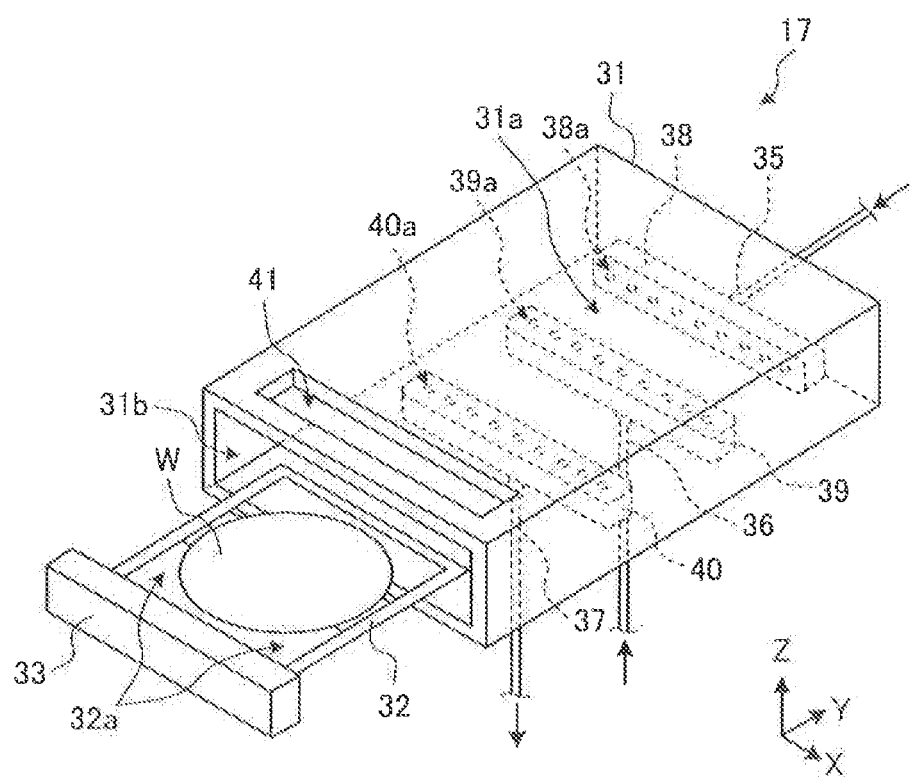
FIG. 3 is an external perspective view illustrating the configuration of a drying processing unit according to the embodiment.

Next, the configuration of the drying processing unit 17 will be described. FIG. 3 is an external perspective view illustrating the configuration of the drying processing unit 17 according to the embodiment.

The drying processing unit 17 has a processing container 31, a holding plate 32, a lid 33, and a movement mechanism (not illustrated). The housing-type processing container 31 is a container in which a processing chamber 31a capable of accommodating a wafer W having a diameter of, for example, 300 mm is formed, and a carry-in port 31b through which a wafer W is carried into the processing chamber 31a is provided adjacent to the processing chamber 31a. Since the processing chamber 31a is required to withstand the high pressure of the supercritical fluid, the processing chamber 31a is formed to be narrow (for example, having a height of about 8 mm).

The holding plate 32 holds the wafer W as an object to be processed in the horizontal direction. The lid 33 supports the holding plate 32 and closes the carry-in port 31b when the wafer W is carried into the processing chamber 31a.

The movement mechanism (not illustrated) is provided on the lid 33, and the holding plate 32, on which the wafer W is held, and the lid 33, is capable of being carried into the processing chamber 31a from the carry-in port 31b, and carried out to the outside of the carry-in port 31b from the inside of the processing chamber 31a. That is, the movement mechanism is capable of reciprocating the holding plate 32 and the lid 33 in the Y-axis direction in FIG. 3.

In addition, the processing container 31 has supply ports 35, 36 and a discharge port 37 provided in the wall portion thereof. The supply ports 35, 36 and the discharge port 37 are respectively connected to a supply flow path and a discharge flow path, which are respectively provided on the upstream side and the downstream side of the drying processing unit 17 so as to circulate a supercritical fluid.

The supply port 35 is connected to a side surface opposite to the carry-in port 31b in the housing-type processing container 31. Further, the supply port 36 and the discharge port 37 are connected to the bottom surface of the processing chamber 31a. Although FIG. 3 illustrates two supply ports 35, 36 and one discharge port 37, the numbers of supply ports 35, 36 and discharge ports 37 are not particularly limited.

In addition, the processing chamber 31a is provided with fluid supply headers 38, 39 and a fluid discharge header 40. A plurality of supply ports 38a, 39a are formed side by side in the fluid supply headers 38, 39 in the longitudinal direction of the fluid supply headers 38, 39, and a plurality of discharge ports 40a are formed side by side in the fluid discharge header 40 in the longitudinal direction of the fluid discharge header 40.

The fluid supply header 38 is connected to the supply port 35, and is provided on the side opposite to the carry-in port 31b in the processing container 31. In addition, the plurality of supply ports 38a formed side by side in the fluid supply header 38 faces the carry-in port 31b side.

The fluid supply header 39 is connected to the supply port 36 and is provided in the center of the bottom surface of the processing chamber 31a. In addition, the plurality of supply ports 39a formed side by side in the fluid supply header 39 faces upward.

The fluid discharge header 40 is connected to the discharge port 37 and is provided on the carry-in port 31b side on the bottom surface of the processing chamber 31a. In addition, the plurality of discharge ports 40a formed side by side in the fluid discharge header 40 faces upward.

The fluid supply headers 38, 39 supply the supercritical fluid to the processing chamber 31a. Further, the fluid discharge header 40 guides and discharges the supercritical fluid in the processing chamber 31a to the outside of the processing chamber 31a. The supercritical fluid discharged to the outside of the processing container 31 via the fluid discharge header 40 includes an IPA liquid dissolved in the supercritical fluid from the front surface of the wafer W.

The supercritical fluid is supplied from the supply ports 38a, 39a of the fluid supply headers 38, 39 arranged as described above to the processing chamber 31a, and the supercritical fluid discharged from the processing chamber 31a via the discharge ports 40a of the fluid discharge header 40. Thus, a laminar flow of the supercritical fluid flowing in a predetermined direction around the wafer W is formed in the processing chamber 31a.

The laminar flow of the supercritical fluid flows from, for example, the fluid supply header 38 toward the upper portion of the carry-in port 31b along the front surface of the wafer W above the wafer W. Furthermore, the laminar flow of the supercritical fluid turns downward from the upper side of the carry-in port 31b, passes through the vicinity the carry-in port 31b, and flows toward the fluid discharge header 40.

In the example of the laminar flow, in the inside of the drying processing unit 17, the laminar flow of the supercritical fluid passes through the opening 32a formed between the wafer W and the lid 33 in the holding plate 32.

From the viewpoint of reducing the load that may be applied to the wafer W at the time of supplying the supercritical fluid to the processing chamber 31a and at the time of discharging the supercritical fluid from the processing chamber 31a, a plurality of fluid supply headers and a plurality of fluid discharge headers may be provided.

Further, a through hole 41 is formed through the processing container 31 vertically at the carry-in port 31b side. A pressing mechanism (not illustrated) is inserted into the through hole 41, and the pressing mechanism presses the lid 33 toward the processing chamber 31a against the internal pressure provided by the supercritical fluid supplied to the processing chamber 31a, thereby closing the processing chamber 31a.

In the drying processing unit 17, the IPA liquid between the patterns formed on the wafer W is gradually dissolved in the supercritical fluid by coming into contact with the supercritical fluid which is in a high-pressure state (e.g., 16 MPa), and the IPA liquid is gradually replaced with the supercritical fluid between the patterns. Finally, the space between the patterns is filled only with the supercritical fluid.

Then, after the IPA liquid is removed from the space between the patterns, the pressure in the processing chamber 31a is reduced from the high-pressure state to the atmospheric pressure, so that $CO_2$ changes from the supercritical state to the gas state, and the space between the patterns is filled only with the gas. In this way, the IPA liquid between the patterns is removed, and the drying processing of the wafer W is completed.

Here, the supercritical fluid has a low viscosity and has a high ability to dissolve a liquid compared with a liquid (e.g., the IPA liquid). Furthermore, no interface exists between a supercritical fluid and a liquid or gas in an equilibrium state. Thus, in the drying processing using the supercritical fluid, it is possible to dry the liquid without being affected by a surface tension. Therefore, according to the embodiment, it is possible to prevent the patterns from falling down during the drying processing.

In the embodiment, the IPA liquid is used as a drying prevention liquid and $CO_2$ in the supercritical state is used as the processing fluid. However, a liquid other than the IPA may be used as the drying prevention liquid, or a fluid other than $CO_2$ in the supercritical state may be used as the processing fluid. In addition, for example, a heat insulating material or a tape heater may be provided on the surface of the processing container 31 so that the supercritical fluid supplied to the processing chamber 31a is capable of maintaining a predetermined temperature.

<Outline of Cleaning Apparatus>

Figure 4:
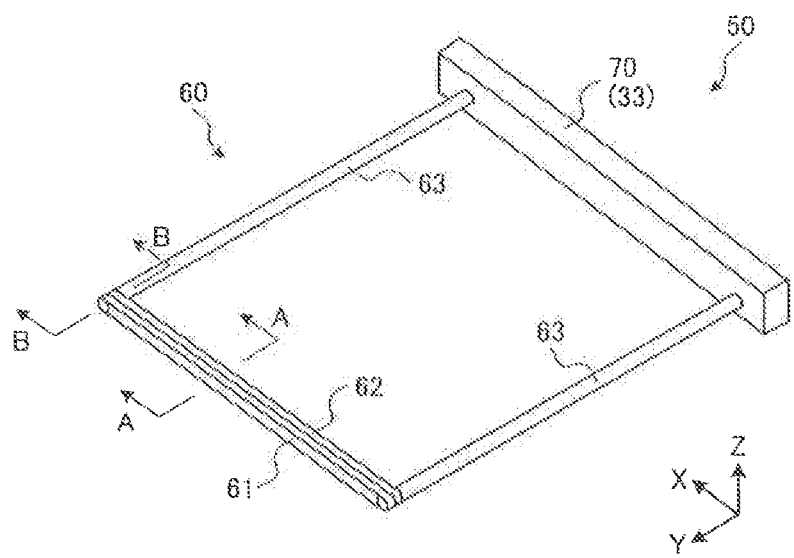
FIG. 4 is an external perspective view illustrating the configuration of a cleaning processing unit according to the embodiment.

Subsequently, the outline of the cleaning apparatus 50 according to the embodiment will be described with reference to FIG. 4. FIG. 4 is an external perspective view illustrating the configuration of the cleaning apparatus 50 according to the embodiment.

As illustrated in FIG. 4, the cleaning apparatus 50 includes a nozzle 60 and a scanning mechanism 70. The nozzle 60 is capable of discharging gas G (see, e.g., FIG. 5) toward the inner wall surface 31c (see, e.g., FIGS. 10A and 10B) of the processing chamber 31a. As illustrated in FIG. 4, the nozzle 60 has a nozzle forming unit 61, a joint 62, and a pair of pipes 63.

The nozzle forming unit 61 is configured to be able to eject the gas G in a predetermined direction. The nozzle forming unit 61 has a rod shape and has a length slightly shorter than the width of the carry-in port 31b of the processing container 31.

The joint 62 has a rod shape and has a length substantially equal to that of the nozzle forming unit 61. The joint 62 is provided between the nozzle forming unit 61 and the pair of pipes 63 so as to cover the groove portion 61a (see, e.g., FIG. 5) formed in the nozzle forming unit 61 and cover the nozzle forming unit 61 and the pair of pipes 63.

One ends of the pair of pipes 63 are connected to the joint 62, and the other ends are connected to a gas supply mechanism (not illustrated) via, for example, the lid 33. Then, the gas G is supplied from the gas supply mechanism to the nozzle forming unit 61 via the joint 62. In addition, the nozzle forming unit 61, the joint 62, and the pair of pipes 63 are formed of the same material (e.g., stainless steel) and integrated by, for example, welding.

The scanning mechanism 70 may allow the nozzle 60 to scan along the inner wall surface 31c in the processing chamber 31a. In the embodiment, the scanning mechanism 70 is configured by a movement mechanism (not illustrated) provided on the lid 33. That is, in the embodiment, the cleaning apparatus 50 is configured by detaching the holding plate 32 originally attached to the lid 33 and attaching the nozzle 60 to the lid 33 instead of the holding plate 32.

Figure 5:
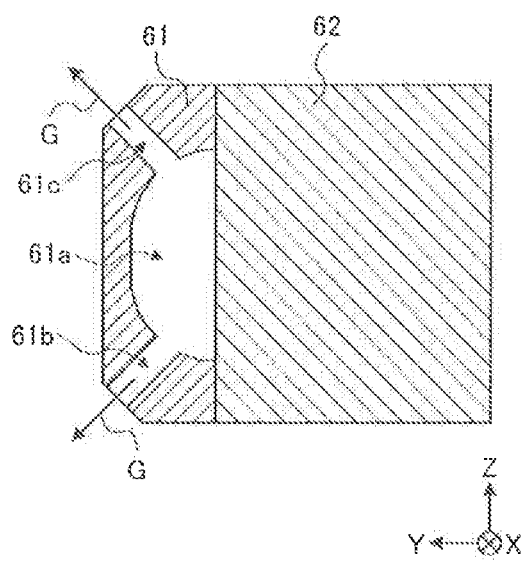
FIG. 5 is a cross-sectional view taken along line A-A in FIG. 4.

Next, the detailed configuration of the nozzle 60 will be described with reference to FIGS. 5 to 7. FIG. 5 is a cross-sectional view taken along line A-A of FIG. 4, and is a cutaway view in the central region of the nozzle forming unit 61.

As illustrated in FIG. 5, in the nozzle forming unit 61, the groove portion 61a and ejection ports 61b, 61c are formed. The groove portion 61a is formed in the longitudinal direction of the nozzle forming unit 61 on the surface of the nozzle forming unit 61 which is in contact with the joint 62. By covering the groove portion 61a with the joint 62, a flow path that allows the gas G to flow from the both end portions of the groove portion 61a to the plurality of ejection ports 61b, 61c is formed.

The ejection ports 61b, 61c are formed so as to penetrate between the outer wall surface and the inner wall surface of the groove portion 61a. The ejection port 61b is formed to face downward in a direction away from the scanning mechanism 70. The ejection port 61c is formed to face downward in a direction away from the scanning mechanism 70.

Although not illustrated, a plurality of the ejection ports 61b and a plurality of ejection ports 61c are formed side by side along the longitudinal direction of the nozzle forming unit 61.

Figure 6:
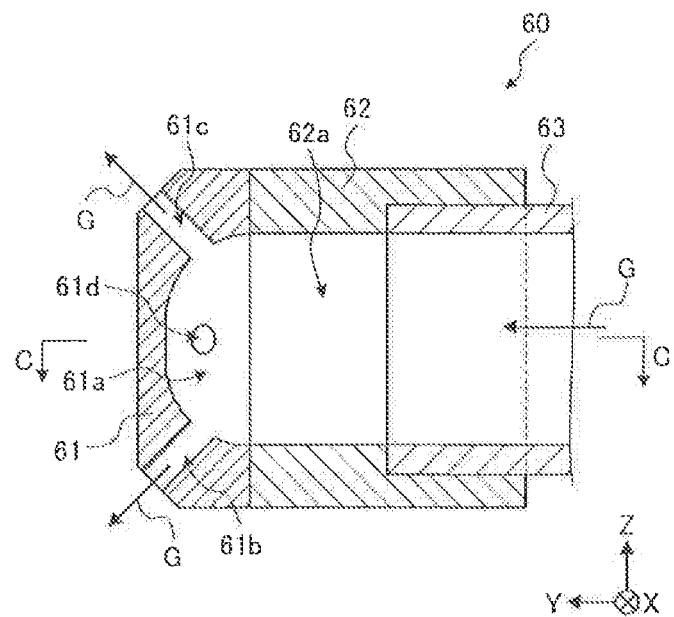
FIG. 6 is a cross-sectional view taken along line B-B in FIG. 4.
Figure 7:
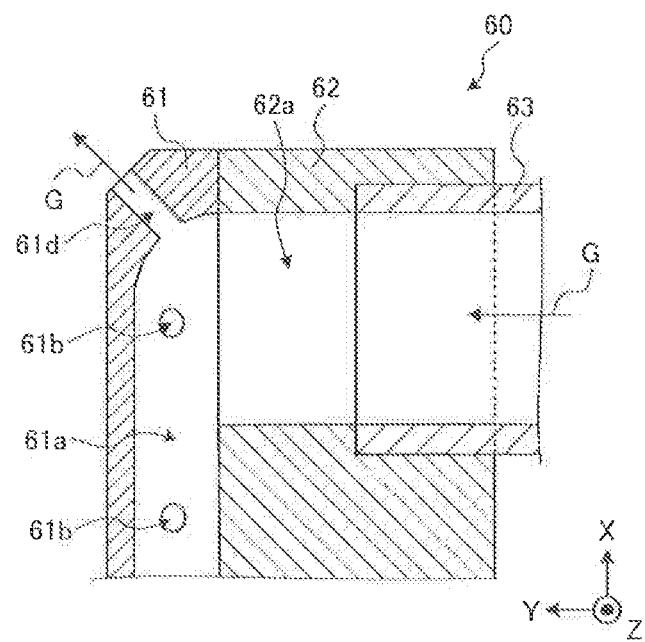
FIG. 7 is a cross-sectional view taken along line C-C in FIG. 6.

FIG. 6 is a cross-sectional view taken along line B-B of FIG. 4, and FIG. 7 is a cross-sectional view taken along line C-C of FIG. 6. FIGS. 6 and 7 are cross-sectional views of an end portion region of the nozzle forming unit 61. As illustrated in FIG. 6, the groove portion 61a and the ejection ports 61b, 61 c are also formed in the end portion regions of the nozzle forming portion 61 as in the central region.

As illustrated in FIG. 7, an ejection port 61d is formed laterally in the nozzle forming unit 61 so as to extend in a direction away from the scanning mechanism 70. Such an ejection port 61d is similarly formed on the other end side of the nozzle forming unit 61.

As illustrated in FIGS. 6 and 7, the joint 62 has a through hole 62a formed therethrough in the Y-axis direction, and the through hole 62a is connected to the groove portion 61a. Further, a pipe 63 is connected to the through hole 62a of the joint 62.

Thus, the gas G flowing through the pipe 63 is ejected from the ejection ports 61b, 61c, 61d to the outside via the through hole 62a of the joint 62 and the groove portion 61a of the nozzle forming unit 61.

As described above, by forming the nozzle 60 in the form divided into the nozzle forming unit 61, the joint 62, and the pair of pipes 63, it is possible to form the nozzle 60 having a complicated internal shape with high accuracy.

<Details of Cleaning Processing>

Figure 8:
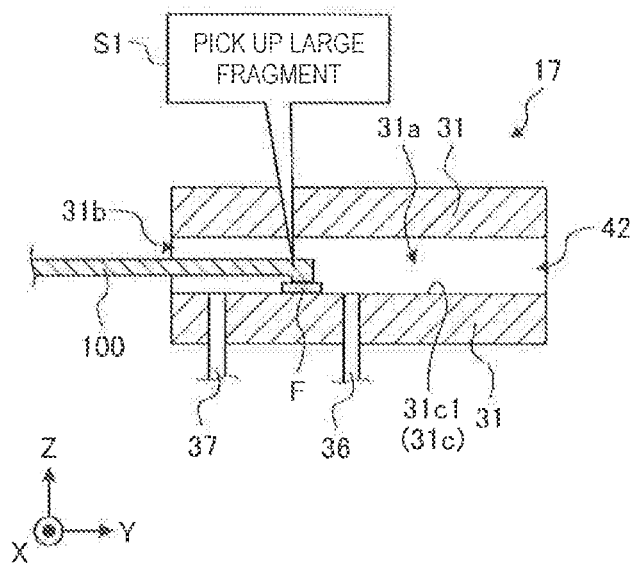
FIG. 8 is a view for explaining a pick-up processing according to the embodiment.

Next, details of a processing of cleaning the processing chamber 31a of the processing container 31 with the cleaning apparatus 50 will be described with reference to FIGS. 8 to 10B. FIG. 8 is a view for explaining a pick-up processing according to the embodiment. In addition, FIGS. 8 to 10B are cross-sectional views of the processing container 31 as seen from a side (X-axis direction), in which illustration of the fluid supply header 39 and the fluid discharge header 40 is omitted.

As illustrated in FIG. 8, in the cleaning processing in the processing chamber 31a, initially, relatively large (e.g., 10 mm or more) fragments F among the fragments F of the wafer W which are broken and scattered in the processing chamber 31a are picked up and removed by a pickup jig 100 (step S1).

In this pickup processing, for example, fragments F falling on the lower main surface 31c1 of the inner wall surface 31c of the processing chamber 31a is visually observed, and the observed fragments F are picked up by the pickup jig 100.

As the pickup jig 100, for example, a vacuum tweezer may be used. However, the pickup jig 100 is not limited to the vacuum tweezer, and any jig may be used as long as it can pick up the fragments F from the processing chamber 31a in a narrow space.

Before the pickup processing, the supply port 35 and the fluid supply header 38 provided on the side opposite to the carry-in port 31b in the processing container 31 may be detached, and an opening 42 may be formed on the side opposite to the carry-in port 31b as illustrated in FIG. 8.

Thus, it is possible to radiate light from one side (e.g., the opening 42) of the processing chamber 31a and pick up the fragments F with the pickup jig 100 while visually observing from the other side (e.g., the carry-in port 31b). Therefore, according to the embodiment, it is possible to perform the pickup processing more easily.

Figure 9:
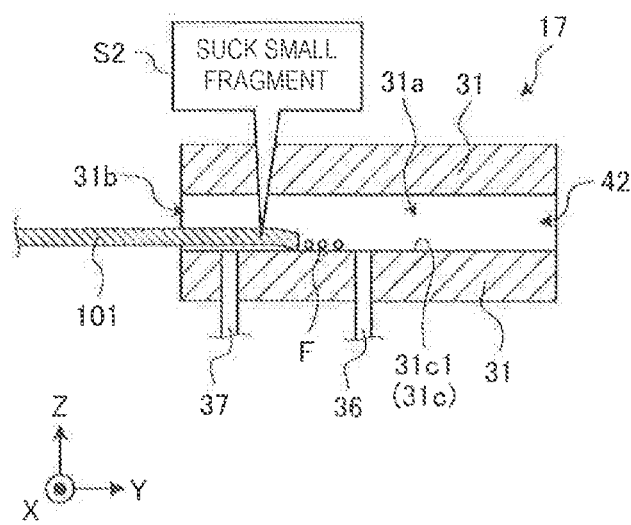
FIG. 9 is a view for explaining a suction processing according to the embodiment.

FIG. 9 is a view for explaining a suction processing according to the embodiment. Following the above-described pickup processing, as illustrated in FIG. 9, among fragments F of the wafer W which are broken in the processing chamber 31a and scattered, relatively small (e.g., smaller than 10 mm) fragments F are sucked by the suction jig 101 (step S2).

In this suction step, for example, the entire main surface 31c1 of the processing chamber 31a is scanned by the suction jig 101 so as to suck small fragments F scattered on the main surface 31c1.

As the suction jig 101, for example, a cleaner nozzle may be used. However, the suction jig 101 is not limited to the cleaner nozzle, and any jig may be used as long as it can suck small fragments F from the processing chamber 31a in a narrow space.

Figure 10A:
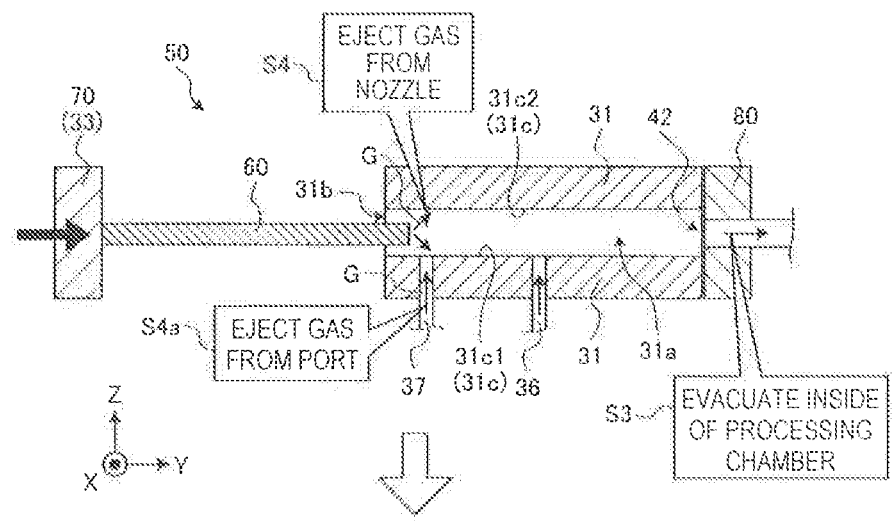
FIGS. 10A and 10B are views for explaining an exhaust processing and an ejection gas scanning processing according to the embodiment.
Figure 10B:
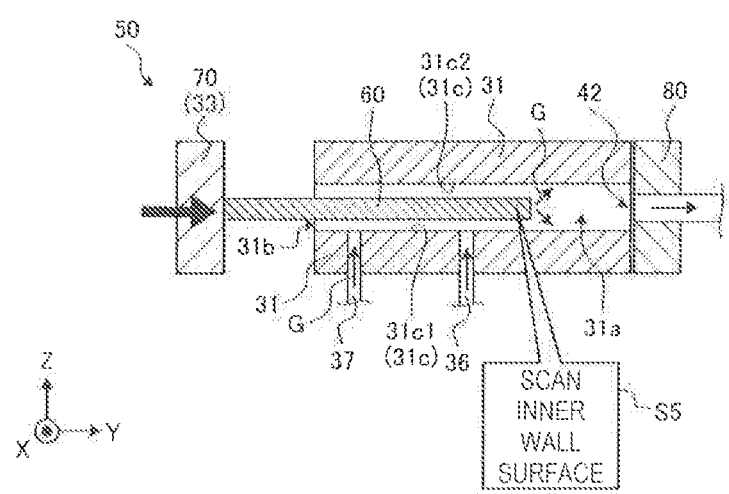

FIGS. 10A and 10B are views for explaining an exhaust processing and an ejection gas scanning processing according to the embodiment. As illustrated in FIG. 10A, an exhaust mechanism 80 configured to evacuate the inside of the processing chamber 31a is attached to the opening 42 of the processing chamber 31a. Then, the inside of the processing chamber 31a is evacuated by a predetermined amount (e.g., 650 L/min) by the exhaust mechanism 80 (step S3).

Further, the nozzle 60 is attached to the lid 33 provided with the scanning mechanism 70 so as to form the cleaning apparatus 50. Then, the nozzle 60 is disposed along the carry-in port 31b, and the gas G is ejected from the nozzle 60 toward the inner wall surface 31c of the processing chamber 31a by a predetermined amount (e.g., 200 L/min) (step S4).

Specifically, the gas G ejected from the ejection port 61b of the nozzle forming unit 61 is ejected onto the lower main surface 31c1 of the inner wall surface 31c of the processing chamber 31a, and the gas G ejected from the ejection port 61c of the nozzle forming unit 61 is ejected onto the upper main surface 31c2 of the inner wall surface 31c of the processing chamber 31a. As the gas G ejected from the nozzle 60, for example, air or nitrogen gas may be used.

Then, as illustrated in FIG. 10B, the scanning mechanism 70 is operated to cause the nozzle 60 to scan along the inner wall surface 31c in the processing chamber 31a (step S5). Specifically, the nozzle 60 is caused to scan at a predetermined speed (e.g., 3 mm/s) from the carry-in port 31b of the processing container 31 toward the opening 42.

Here, in the embodiment, as described above, the nozzle forming unit 61 has a length slightly shorter than the width of the carry-in port 31b and a plurality of the ejection ports 61b and 61c are formed side by side in the longitudinal direction of the nozzle forming unit 61. Accordingly, by causing the nozzle 60 to scan from the carry-in port 31b of the processing container 31 toward the opening 42, it is possible to remove fine fragments F attached to the main surfaces 31c1, 31c2 from the entire main surfaces 31c1, 31c2.

That is, in the embodiment, by performing the ejection gas scanning step of injecting the gas G ejected from the nozzle 60 in the processing chamber 31a, the fine fragments F adhering to the main surfaces 31c1, 31c2 may be effectively removed from the main surfaces 31c1, 31c2. Therefore, according to the embodiment, it is possible to cleanly clean the inside of the narrow processing chamber 31a.

In the embodiment, since the ejection port 61d configured to eject the gas G toward the lateral side is formed in the nozzle forming unit 61, it is also possible to remove fine fragments F adhering to the side surfaces 31c3, 31c4 of the processing chamber 31a (see, e.g., FIG. 11) in addition to the fragments adhering to the main surfaces 31c1, 31c2.

Further, in the embodiment, the exhaust step of evacuating the inside of the processing chamber 31a may be performed using the exhaust mechanism 80 while performing the ejection gas scanning step. Thus, it is possible to effectively discharge the fine fragments F blown off by the gas G from the main surfaces 31c1, 31c2 to the outside of the processing chamber 31a. Accordingly, according to the embodiment, it is possible to clean the inside of the narrow processing chamber 31a more cleanly.

In the embodiment, the nozzle 60 may be caused to scan along the main surfaces 31c1, 31c2 having the largest area in the inner wall surface 31c in the processing chamber 31a. As a result, since it is possible to remove fine fragments F adhering to the main surfaces 31c1, 31c2 having the largest area, it is possible to clean the inside of the narrow processing chamber 31a more clearly.

Further, in the embodiment, as illustrated in FIGS. 10A and 10B, the nozzle 60 may be caused to scan toward the exhaust mechanism 80 in the ejection gas scanning step. Thus, since it is possible to form an airflow flowing from the nozzle 60 toward the exhaust mechanism 80 in the processing chamber 31a, it is possible to discharge the fine fragments F to the outside of the processing chamber 31a more effectively. Accordingly, according to the embodiment, it is possible to clean the inside of the narrow processing chamber 3a more cleanly.

Further, in the embodiment, as illustrated in FIGS. 10A and 10B, the direction of the gas G ejected from the nozzle 60 may be set to the direction toward the inner wall surface 31c and to the direction in which the nozzle 60 is scanned (i.e., the direction toward the exhaust mechanism 80). As a result, it is possible to form the airflow flowing toward the exhaust mechanism 80 in the processing chamber 31a more intensely. Accordingly, according to the embodiment, it is possible to clean the inside of the narrow processing chamber 31a more cleanly.

Further, in the embodiment, the ejection gas scanning step may be repeatedly performed a plurality of times (e.g., about 15 times). Thus, it is possible to firmly remove fine fragments F adhering to the main surfaces 31c1, 31c2 from the entire main surfaces 31c1, 31c2. Accordingly, according to the embodiment, it is possible to clean the inside of the narrow processing chamber 31a more cleanly.

In the case where the ejection gas scanning step is repeatedly performed, when returning the nozzle 60 from the opening 42 side of the processing chamber 31a to the carry-in port 31b side, the nozzle 60 may be returned while ejecting the gas G from the nozzle 60 or while stopping the ejection of the gas G. Further, the operation of returning the nozzle 60 to the carry-in port 31b side may be performed at a higher speed (e.g., 50 mm/s) than that of the ejection gas scanning step.

Before the ejection gas scanning step, a gas ejection mechanism (not illustrated) may be attached to the supply port 36 and the discharge port 37 and the gas ejection mechanism may be operated such that the gas G is ejected from the supply port 36 and the discharge port 37 to the inside of the processing chamber by a predetermined amount (e.g., 80 L/min) (step S4a).

Through this processing, fragments F that have been broken in the processing chamber 31a and dropped into the supply port 36 and the discharge port 37 are able to be returned to the inside of the processing chamber 31a. Therefore, according to the embodiment, it is possible to clean the inside of the processing chamber 31a including the supply port 36 and the discharge port 37 more cleanly.

In the embodiment, an example is represented in which, as the scanning mechanism 70, a movement mechanism provided on the lid 33 of the drying processing unit 17 is used, and the nozzle 60 is caused to scan in the direction in which the wafer W is carried in from the carry-in port 31b by the movement mechanism. However, it is not always necessary to use the movement mechanism provided on the lid 33 as the scanning mechanism 70.

However, as in the embodiment, by using the movement mechanism provided on the lid 33 as the scanning mechanism 70 and causing the nozzle 60 to scan in the direction in which the wafer W is carried in from the carry-in port 31b by the movement mechanism, it is possible to configure the cleaning apparatus 50 without separately providing a dedicated scanning mechanism 70. Accordingly, according to the embodiment, it is possible to configure the cleaning device 50 at a low cost.

<Modification>

Figure 11A:
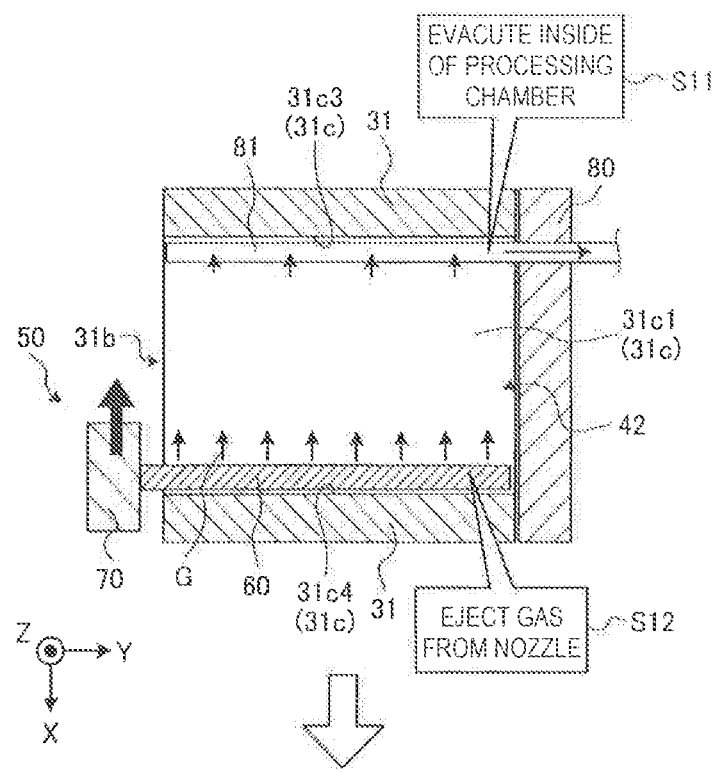
FIGS. 11A and 11B are views for explaining an exhaust processing and an ejection gas scanning processing according to a modification of the embodiment.
Figure 11B:
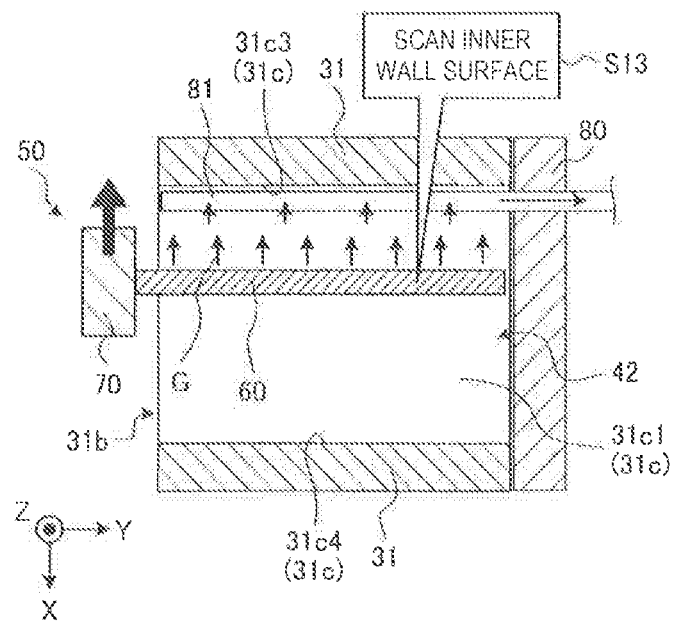

Subsequently, a modification of the above-described embodiment will be described with reference to FIGS. 11A to 13. FIGS. 11A and 11B are views for explaining an exhaust processing and an ejection gas scanning processing according to the modification of the embodiment, and are cross-sectional view when the processing container 31 is viewed from above.

In the above-described embodiment, the case where the nozzle 60 is caused to scan in the direction in which the wafer W is carried in from the carry-in port 31b has been described. However, the scanning direction of the nozzle 60 is not limited to this direction, and for example, the nozzle 60 may be caused to scan in a direction perpendicular to the direction in which the wafer W is carried in.

For example, as illustrated in FIG. 11A, an exhaust unit 81 of an exhaust mechanism 80 for exhausting the inside of a processing chamber 31a is disposed along a side surface 31c3 on one side (the X-axis negative direction side in the drawing) of the inner wall surface 31c of the processing chamber 31a. Then, the inside of the processing chamber 31a is evacuated by the exhaust unit 81 (step S11).

Then, a nozzle 60 of a cleaning apparatus 50 according to the modification is disposed along the side surface 31c4 on the other side (the X axis positive direction side in the drawing) of the inner wall surface 31c of the processing chamber 31a.

Figure 12:
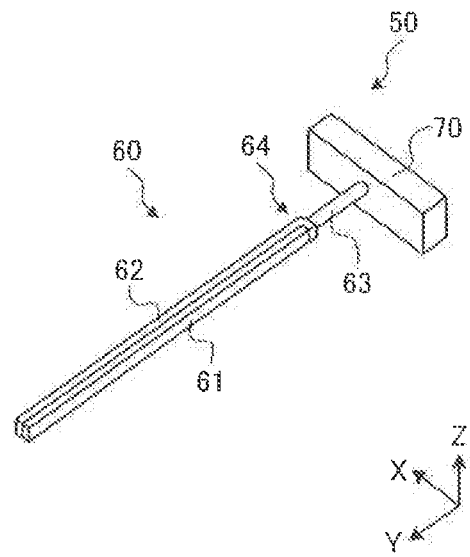
FIG. 12 is an external perspective view illustrating the configuration of a cleaning processing unit according to a modification of the embodiment.
Figure 13:
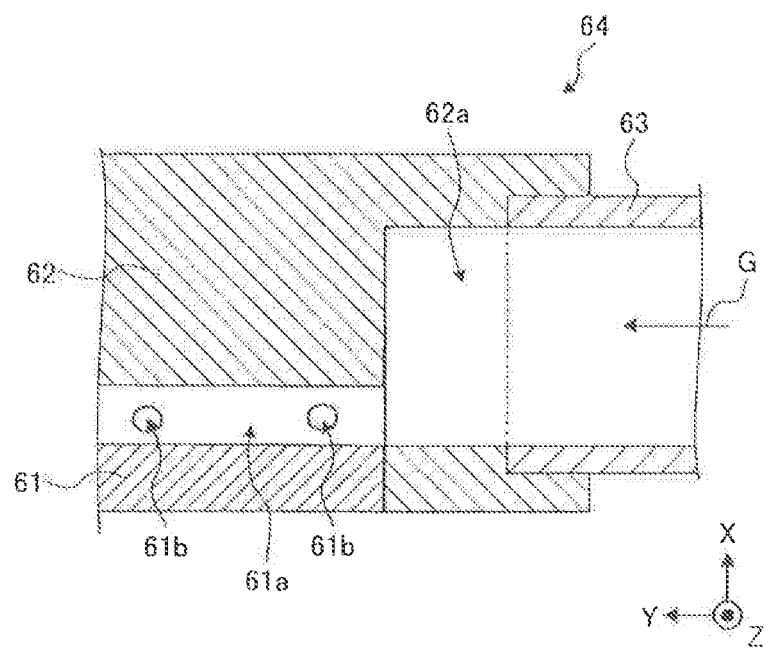
FIG. 13 is a cross-sectional view for explaining a connection portion of a nozzle according to the modification of the embodiment.

Here, the configuration of the cleaning apparatus according to the modification is described with reference to FIGS. 12 and 13. FIG. 12 is an external perspective view illustrating the configuration of the cleaning apparatus 50 according the modification of the embodiment, and FIG. 13 is a cross-sectional view for explaining a connection portion 64 of a nozzle 60 according to the modification of the embodiment.

As illustrated in FIG. 12, the cleaning apparatus 50 includes a nozzle 60 and a scanning mechanism 70. The nozzle 60 has a nozzle forming unit 61, a joint 62, and a pipe 63, and the nozzle forming unit 61, the joint 62, and the pipe 63 are connected by a connection portion 64. Further, the scanning mechanism 70 may cause the nozzle 60 to scan in a direction perpendicular to the longitudinal direction of the nozzle 60.

The nozzle forming unit 61 is configured to be able to eject the gas G in a predetermined direction. The nozzle forming unit 61 has a rod shape and has a length substantially equal to the depth of the processing chamber 31a. As illustrated in FIG. 13, as in the embodiment, the nozzle forming unit 61 is formed with a groove 61a along the longitudinal direction thereof and a plurality of grooves 61b, 61c are formed along the longitudinal direction of the nozzle forming unit 61 (the ejection ports 61c are not illustrated) are formed side by side.

In the nozzle 60 of the modification, the ejection ports 61b are formed to face downward in a direction perpendicular to the direction away from the scanning mechanism 70, and the ejection ports 61c are formed to face upward in the direction perpendicular to the direction away from the scanning mechanism 70. Then, the gas G is ejected from these ejection ports 61b. 61c.

As illustrated in FIG. 12, the joint 62 is substantially L-shaped and has a length slightly longer than the nozzle forming unit 61. The joint 62 is provided adjacent to the nozzle forming unit 61 so as to cover the groove portion 61a of the nozzle forming portion 61 and to connect the nozzle forming unit 61 and the pipe 63 to each other. The pipe 63 is connected to one end of the joint 62, and the gas G is supplied from the gas supply mechanism (not illustrated) to the nozzle forming unit 61 via the joint 62.

As illustrated in FIG. 13, the joint 62 has a through hole 62a formed through at least a portion thereof in the Y-axis direction, and the through hole 62a is connected to the groove portion 61a. In addition, a pipe 63 is connected to the through hole 62a of the joint 62.

Thus, the gas G flowing through the pipe 63 is ejected from the ejection ports 61b, 61c to the outside via the through hole 62a of the joint 62 and the groove portion 61a of the nozzle forming unit 61.

In the nozzle 60 of the modification, the gas G is ejected from the ejection ports 61b downward in a direction perpendicular to the direction away from the scanning mechanism 70, and ejected from the ejection ports 61c upward in the direction perpendicular to the direction away from the scanning mechanism 70.

Descriptions will be made referring back to FIGS. 11A and 11B. As illustrated in FIG. 11A, from the nozzle 60 disposed along the side surface 31c4, the gas G is ejected toward the exhaust unit 81 of the exhaust mechanism 80 and further toward the main surfaces 31c1, 31c2 (step S12).

Then, as illustrated in FIG. 11B, the scanning mechanism 70 is operated to cause the nozzle 60 to scan along the inner wall surface 31c in the processing chamber 31a (step S13). Specifically, the nozzle 60 is caused to scan along the main surfaces 31c, 31c2 from one side surface 31c4 to the other side surface 31c3 of the processing container 31.

Thus, as in the embodiment, in the modification, it is possible to remove fine fragments F adhering to the main surfaces 31c1, 31c2 from the entire main surfaces 31c1, 31c2. Accordingly, according to the modification, since it is possible to effectively remove the fine fragments F adhering to the main surfaces 31c1, 31c2, it is necessary to clean the inside of the narrow processing chamber 31a cleanly.

In the modification, as in the embodiment, the gas G may be ejected to the inside of the processing chamber 31a from the supply port 36 and the discharge port 37 before the exhaust gas scanning processing. Thus, since it is possible to return the fragments F that have been broken in the processing chamber 31a and dropped into the supply port 36 and the discharge port 37 to the inside of the processing chamber 31a, it is possible to clean the inside of the processing chamber 31a including the supply port 36 and the discharge port 37 more cleanly.

<Details of Cleaning Processing>

Figure 14:
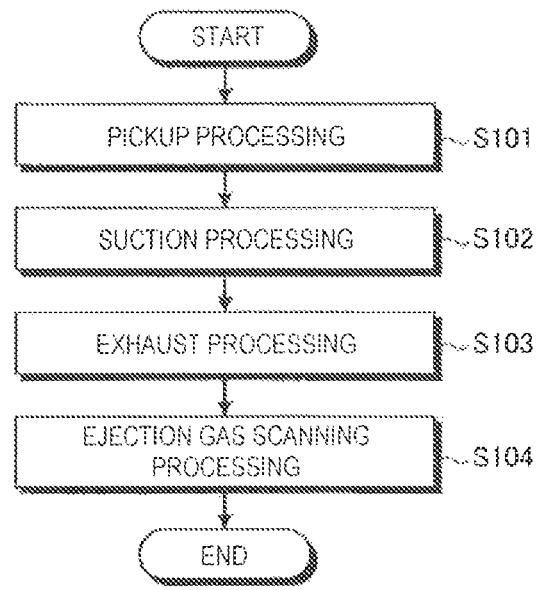
FIG. 14 is a flowchart illustrating a procedure of a cleaning processing executed by a cleaning apparatus.

Next, with reference to FIG. 14, details of the cleaning processing of the substrate processing apparatus according to the embodiment will be described. FIG. 14 is a flowchart illustrating the procedure of the cleaning processing executed by the cleaning apparatus 50.

First, the supply port 35 and the fluid supply header 38 provided on the side opposite to the carry-in port 31b m the processing container 31 are detached, and an opening 42 is formed on the side opposite to the carry-in port 31b. Then, a pickup processing is performed to pick up relatively large fragments F among the fragments F of a wafer W, which are broken and scattered in the processing chamber 31a, using the pickup jig 100 (in step S101).

In this pickup processing, for example, while radiating light from the opening 42 of the processing chamber 3a, the broken fragments F falling from the carry-in port 31b to the lower main surface 31c is visually observed. Then, the observed fragments F are picked up by the pickup jig 100.

Subsequently, a suction processing is performed to suck and remove relatively small fragments F among the fragments F of a wafer W, which are broken and scattered in the processing chamber 31a, using the suction jig 101 (step 102). In this suction processing, for example, the entire main surface 31c1 of the processing chamber 31a is scanned by the suction jig 101 so as to suck small fragments F scattered on the main surface 31c1.

Subsequently, by attaching the exhaust mechanism 80 to the opening 42 of the processing container 31 and operating the exhaust mechanism 80, an exhaust processing is performed to evacuate the processing chamber 31a by a predetermined amount (step S103).

Subsequently, the nozzle 60 is disposed along the carry-in port 31b, and the gas G is ejected from the nozzle 60 toward the inner wall surface 31c of the processing chamber 31a. Then, the scanning mechanism 70 is operated to perform an ejection gas scanning processing of causing the nozzle 60, which ejected the gas G, to scan toward the opening 42 along the inner wall surface 31c (step S104).

Then, by repeating the ejection gas scanning processing a predetermined number of times, a series of cleaning processings for the drying processing unit 17 are completed.

Although the embodiment of the present disclosure has been described above, the present disclosure is not limited to the above embodiment, and various modifications can be made without departing from the gist thereof. For example, in the embodiment, the cleaning processing is performed for the purpose of removing the fragments F of the wafer W broken in the processing chamber 31a, but the cleaning processing in the processing chamber 31a may be performed for other purposes.

For example, in the drying processing using the supercritical fluid of $CO_2$, moisture and oil maintained in a state of fluid in the raw material $CO_2$ may be converted into mist in the drying processing unit 17 for some reasons, and may float and adhere to the inside of the processing chamber 31a as particles. Therefore, by performing the cleaning processing according to the embodiment, it is possible to remove the particles floating and adhering to the inside of the processing chamber 31a so as to clean the processing chamber 31a cleanly.

The cleaning processing for removing such particles may be carried out, for example, when the number of particles frequently measured by a particle counter in a wafer W, which has been subjected to a drying processing, in each of the drying processing units 17 exceeds a predetermined number.

In addition, the cleaning processing may be performed, for example, in each of the drying processing units 17 when the cumulative time of performing the drying processing on wafers W reaches a predetermined time or more, or may be performed when the cumulative number of wafers reaches a predetermined number or more.

In addition, in the embodiment, a cleaning processing has been described which is performed on the drying process unit 17 that performs the drying processing using a supercritical fluid. However, the cleaning processing according to the embodiment is not limited to the drying process unit 17, and may be applied to any substrate processing apparatus may be used as long as the substrate processing apparatus has a narrow processing chamber.

Further, in the above-described embodiment, an example has been described in which the drying processing unit 17 is disposed horizontally and the carrying-in port 31b is formed on a side surface of the processing container 31. However, the drying processing unit 17 may be disposed vertically, and the carry-in port 31b may be formed in the top or bottom surface of the processing container 31.

Even in this case, the nozzle 60 is capable of cleaning the inside of the processing chamber 31a cleanly by scanning along the inner wall surface 31c while ejecting the gas G toward the inner wall surface 31c of the processing container 31.

The cleaning apparatus 50 according to the embodiment includes a nozzle 60 and a scanning mechanism 70. The nozzle 60 ejects the gas G toward the inner wall surface 31c of the processing chamber 31a in which a substrate (wafer W) is processed. The scanning mechanism 70 causes the nozzle 60 to scan along the inner wall surface 31c in the processing chamber 31a. As a result, it is possible to clean the inside of a narrow processing chamber 31a cleanly.

The cleaning apparatus 50 of the substrate processing apparatus according to the embodiment further includes an exhaust mechanism 80, which exhausts the gas G ejected from the nozzle 60 onto the inner wall surface 31c, to the outside of the processing chamber 31a. As a result, since it is possible to effectively discharge fine fragments F blown off by the gas G from the main surfaces 31c1 and 31c2 to the outside of the processing chamber 31a, it is possible to clean the inside of the narrow processing chamber 31a more cleanly.

Further, in the cleaning apparatus 50 of the substrate processing apparatus according to the embodiment, the scanning mechanism 70 causes the nozzle 60 to scan toward the exhaust mechanism 80. Thus, since it is possible to form an airflow flowing from the nozzle 60 toward the exhaust mechanism 80 in the processing chamber 31a, it is possible to clean the inside of the processing chamber 31a more cleanly.

In the cleaning apparatus 50 of the substrate processing apparatus according to the embodiment, the scanning mechanism 70 causes the nozzle 60 to scan in the direction in which a substrate (wafer W) is carried into the processing chamber 31a from the carry-in port 31b through which the substrate (wafer W) is carried into the processing chamber 31a. Thus, since the cleaning apparatus 50 can be configured without separately providing a dedicated scanning mechanism 70, it is possible to configure the cleaning apparatus 50 at a low cost.

Further, in the cleaning apparatus 50 of the substrate processing apparatus according to the embodiment, the ejection ports 61b, 61c of the gas G formed in the nozzle 60 are formed such that the gas G is ejected in a direction toward the inner wall surface 31c and in the direction in which the nozzle 60 scans. Thus, since it is possible to form an airflow flowing toward the exhaust mechanism 80 in the processing chamber 31a more strongly, it is possible to clean the inside of the processing chamber 31a more cleanly.

In addition, in the cleaning apparatus 50 of the substrate processing apparatus according to the embodiment, the scanning mechanism 70 causes the nozzle 60 to scan along the main surfaces 31c1, 31c2 of the inner wall surface 31c. As a result, since it is possible to remove fine fragments F adhering to the main surfaces 31c1, 31c2 having the largest area, it is possible to clean the inside of the narrow processing chamber 31a more clearly.

In addition, in the cleaning apparatus 50 of the substrate processing apparatus according to the embodiment, in the processing chamber 31a, a processing is performed to bring the substrate (the wafer W) on which a liquid film is formed into contact with the processing fluid in the supercritical state so as to dry the substrate (wafer W). Thus, it is possible to suppress the patterns of the wafer W from falling down during the drying processing.

Further, the cleaning method of the substrate processing apparatus according to the embodiment includes an ejection gas scanning step of causing the nozzle 60, which ejects the gas G toward the inner wall surface 31c of the processing chamber 31a in which the substrate (wafer W) is processed, to scan along the inner wall surface 31c in the processing chamber 31a (step S104). As a result, it is possible to clean the inside of a narrow processing chamber 31a cleanly.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A cleaning apparatus comprising:
a nozzle having a first end, a second end opposite the first end, and a length extending therebetween, the nozzle including a nozzle rod having a groove formed therein and extending along the length of the nozzle, a joint attached to the nozzle rod and extending along the length of the nozzle so as to cover the groove, and a plurality of ejection ports connected to the groove and positioned along the length of the nozzle, the plurality of ejection ports being configured to eject a gas toward an inner wall surface of a processing chamber of a substrate processing apparatus in which a substrate is processed;
at least one pipe having a first end connected to the joint at one of the first end or the second end of the nozzle and configured to supply the gas to the plurality of ejection ports through the groove; and
a lid fixed directly to a second end of the pipe opposite the first end of the pipe, the lid being configured to be moved together with the nozzle and the pipe, as the nozzle and the pipe are moved in a direction along the inner wall surface of the processing chamber,
wherein the lid is configured to be moved such that the nozzle rod is simultaneously moved in a direction in which the substrate is carried into the processing chamber from a carry-in port through which the substrate is carried into the processing chamber.

2. The cleaning apparatus of claim 1, further comprising an exhaust path configured to exhaust the gas ejected from the plurality of ejection ports onto the inner wall surface to an outside of the processing chamber.

3. The cleaning apparatus of claim 2, wherein the lid is configured to be moved such that the nozzle rod is simultaneously moved toward the exhaust path.

4. The cleaning apparatus of claim 1, wherein the plurality of ejection ports are configured to eject gas in a direction toward the inner wall surface of the processing chamber and in a direction in which the nozzle rod is moved.

5. The cleaning apparatus of claim 1, wherein the lid is configured to be moved such that the nozzle rod is simultaneously moved toward a side surface of the inner wall surface of the processing chamber.

6. The cleaning apparatus of claim 1, wherein the length of the nozzle rod faces the direction in which the nozzle and the pipe are moved along the inner wall surface of the processing chamber.

7. A substrate processing apparatus comprising:
   a processing chamber in which a substrate is processed; and
   a cleaning apparatus including:
      a nozzle having a first end, a second end opposite the first end, and a length extending therebetween, the nozzle including a nozzle rod having a groove formed therein and extending along the length of the nozzle, a joint attached to the nozzle rod and extending along the length of the nozzle, and a plurality of ejection ports connected to the groove and positioned along the length of the nozzle, the plurality of ejection ports being configured to eject a gas toward an inner wall surface of the processing chamber;
      at least one pipe having a first end connected to the joint at one of the first end or the second end of the nozzle and configured to supply the gas to the plurality of ejection ports through the groove; and
      a lid fixed directly to a second end of the pipe opposite the first end of the pipe, the lid being configured to be moved together with the nozzle and the pipe, as the nozzle and the pipe are moved in a direction along the inner wall surface of the processing chamber,
   wherein, in the processing chamber, a processing of bringing the substrate on which a liquid film is formed into contact with a processing fluid of a supercritical state so as to dry the substrate is performed, and
   the lid is configured to be moved such that the nozzle rod is simultaneously moved in a direction in which the substrate is carried into the processing chamber from a carry-in port through which the substrate is carried into the processing chamber.

8. A method for cleaning a substrate processing apparatus, the method comprising:
   providing a nozzle having a first end, a second end opposite the first end, and a length extending therebetween, the nozzle including a nozzle rod having a groove formed therein and extending along the length of the nozzle, a joint attached to the nozzle rod and extending along the length of the nozzle so as to cover the groove, and a plurality of ejection ports connected to the groove and positioned along the length of the nozzle, the plurality of ejection ports configured to eject a gas toward an inner wall surface of a processing chamber in which a substrate is processed;
   supplying a gas to the plurality of ejection ports via at least one pipe having a first end connected to the joint at one of the first end or the second end of the nozzle;
   causing a lid fixed directly to a second end of the pipe opposite the first end of the pipe to move the nozzle and the pipe together in a direction along the inner wall surface of the processing chamber; and
   moving the lid and simultaneously moving the nozzle rod in a direction in which the substrate is carried into the processing chamber from a carry-in port through which the substrate is carried into the processing chamber.

* * * * *